(12) United States Patent
Ottlinger et al.

(10) Patent No.: US 10,686,121 B2
(45) Date of Patent: Jun. 16, 2020

(54) METHOD FOR PRODUCING PIEZOELECTRIC MULTI-LAYERED COMPONENTS

(71) Applicant: EPCOS AG, Munich (DE)

(72) Inventors: Marion Ottlinger, Deutschlandsberg (AT); Peter Windisch, Deutschlandsberg (AT)

(73) Assignee: EPCOS AG, Munich (DE)

( * ) Notice: Subject to any disclaimer, the term of this patent is extended or adjusted under 35 U.S.C. 154(b) by 92 days.

(21) Appl. No.: 15/547,055

(22) PCT Filed: Jan. 13, 2016

(86) PCT No.: PCT/EP2016/050580
§ 371 (c)(1),
(2) Date: Jul. 27, 2017

(87) PCT Pub. No.: WO2016/120072
PCT Pub. Date: Aug. 4, 2016

(65) Prior Publication Data
US 2018/0006209 A1 Jan. 4, 2018

(30) Foreign Application Priority Data

Jan. 29, 2015 (DE) .................. 10 2015 101 311

(51) Int. Cl.
*H01L 41/22* (2013.01)
*H01L 41/273* (2013.01)
(Continued)

(52) U.S. Cl.
CPC .......... *H01L 41/273* (2013.01); *H01L 41/047* (2013.01); *H01L 41/0838* (2013.01);
(Continued)

(58) Field of Classification Search
CPC ................. H01L 2224/03; Y10T 29/42; Y10T 29/49155; Y10T 29/435; Y10T 29/49163; Y10T 29/49117; Y10T 29/49144
(Continued)

(56) References Cited

U.S. PATENT DOCUMENTS

| 2006/0238073 A1 | 10/2006 | Ragossnig et al. |
| 2009/0324954 A1 | 12/2009 | Nakajima |

(Continued)

FOREIGN PATENT DOCUMENTS

| DE | 10258444 A1 | 7/2003 |
| DE | 10307825 A1 | 9/2004 |
| DE | 102007041079 A1 | 3/2009 |
| DE | 102011109008 A1 | 1/2013 |

(Continued)

*Primary Examiner* — Thiem D Phan
(74) *Attorney, Agent, or Firm* — Morgan, Lewis & Bockius LLP

(57) ABSTRACT

The present invention relates to a method for producing piezoelectric multi-layered components (2), which comprises the following steps: applying an electrode material (5) to green sheets (3) containing a piezoelectric material, applying a layer of a first auxiliary material (9) to at least one green sheet (3) containing the piezoelectric material, forming a stack (1), in which the green sheets (3), to which electrode material (5) is applied, are arranged one on top of another, wherein at least one ply of the green sheet (3), to which the layer of the first auxiliary material (9) is applied, is arranged in the stack (1), sintering the stack (1), wherein the layer of the first auxiliary material (9) is thinned, and firing the stack (1), wherein the stack (1) is singulated along the at least one ply into at least two multi-layered components (2).

16 Claims, 1 Drawing Sheet

(51) Int. Cl.
  *H01L 41/33*   (2013.01)
  *H01L 41/047*   (2006.01)
  *H01L 41/083*   (2006.01)
  *H01L 41/187*   (2006.01)
  *H01L 41/297*   (2013.01)
  *H01L 41/312*   (2013.01)

(52) U.S. Cl.
  CPC ........ *H01L 41/1876* (2013.01); *H01L 41/297* (2013.01); *H01L 41/312* (2013.01); *H01L 41/33* (2013.01); *Y10T 29/42* (2015.01)

(58) Field of Classification Search
  USPC .................... 29/25.35, 592.1, 825, 846, 851
  See application file for complete search history.

(56) References Cited

U.S. PATENT DOCUMENTS

2010/0225204 A1  9/2010  Hamann et al.
2014/0292161 A1* 10/2014  Dollgast ............. H01L 41/0838
                                                                     310/366

FOREIGN PATENT DOCUMENTS

| JP | H104439 A | 1/1998 |
| JP | 2006108546 A | 4/2006 |
| JP | 2006203070 A | 8/2006 |
| JP | 2006518934 A | 8/2006 |
| JP | 2008258588 A | 10/2008 |
| JP | 2014527712 A | 10/2014 |
| WO | WO-2004077583 A1 | 9/2004 |

* cited by examiner

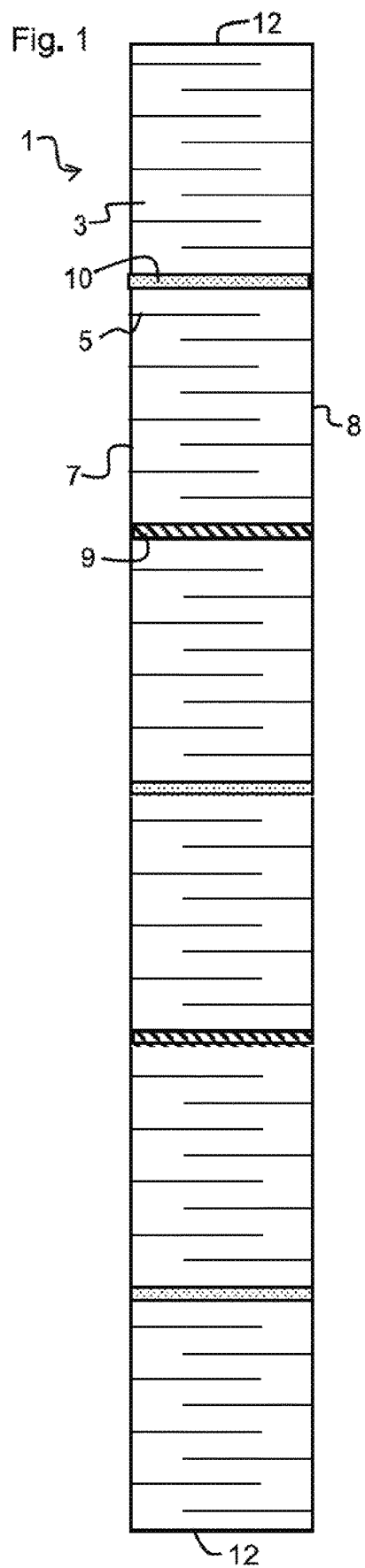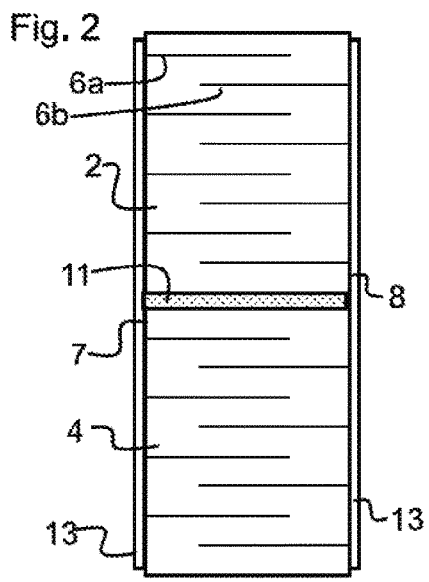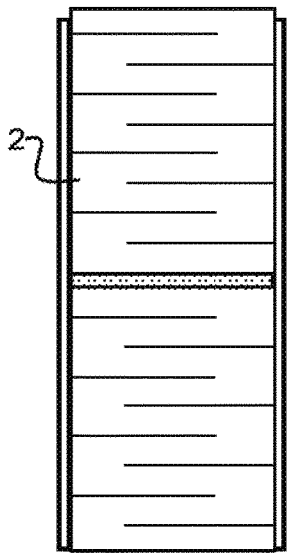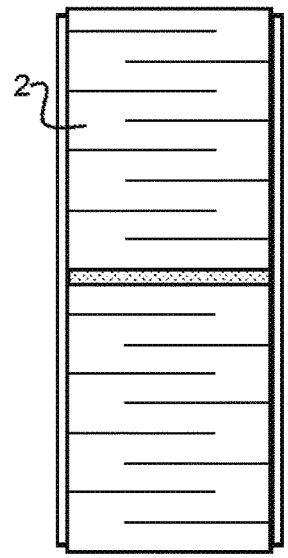

METHOD FOR PRODUCING PIEZOELECTRIC MULTI-LAYERED COMPONENTS

BACKGROUND OF THE INVENTION

Technical Field

The invention relates to piezoelectric components. More particularly, the disclosure relates to methods for producing piezoelectric multi-layered components.

Description of the Related Art

A method of this type is known, for example, from DE 10 2011 109008 A1. A disadvantage of this method, however, is the fact that the multi-layered components are produced by the manufacture of individual parts, as a result of which a considerable outlay on production arises.

A problem to be solved is therefore that of specifying an improved method for producing piezoelectric multi-layered components which, for example, requires a reduced manufacturing outlay.

BRIEF SUMMARY OF THE INVENTION

The above described problem is solved by a method according to patent claim 1. Further embodiments of the method are the subject matter of the further patent claims.

The invention specifies a method for producing piezoelectric multi-layered components, which comprises the following steps:
A) applying an electrode material to green sheets containing a piezoelectric material,
B) applying a layer of a first auxiliary material to at least one green sheet containing the piezoelectric material,
C) forming a stack, in which the green sheets, to which electrode material is applied, are arranged one on top of another, wherein at least one ply of the green sheet, to which the layer of the first auxiliary material is applied, is arranged in the stack,
D) sintering the stack, wherein the layer of the first auxiliary material is thinned, and
E) firing the stack, wherein the stack is singulated along the at least one ply into at least two multi-layered components.

BRIEF DESCRIPTION OF THE DRAWINGS

FIG. 1 shows a stack from which a plurality of multi-layered components are produced before the singulation.

FIG. 2 shows multi-layered components which have been produced by singulation of the stack shown in FIG. 1.

A list of reference signs is provided below:
1 Stack
2 Multi-layered component
3 Green sheet
4 Piezoelectric layer
5 Electrode material
6a First inner electrode
6b Second inner electrode
7 First outer face
8 Second outer face
9 First auxiliary material
10 Second auxiliary material
11 Weakening layer
12 End face
13 Outer electrode

DETAILED DESCRIPTION

The above described method for producing piezoelectric multi-layered components makes it possible to treat a plurality of multi-layered components together in a stack, such that a multiplicity of method steps can be carried out on the stack during the production method. In this way, it is possible to avoid a complex handling of individual components. Only in the firing step, which is carried out late in the method, is the stack singulated to form the individual multi-layered components.

In this case, the singulation during the firing is initiated by the previous weakening of the layer of the first auxiliary material during the sintering and by a temperature shock which is generated during the firing by rapid changes in temperature. The singulation can therefore be effected during the firing by dissolution or separation of the layer of the first auxiliary material. No further working steps are required for the singulation. Accordingly, hardly any additional outlay arises for the singulation of the multi-layered components, since the step of firing always has to be carried out during the production of multi-layered components.

The piezoelectric multi-layered components produced by this method may be in particular piezoelectric actuators. By way of example, these can be used for actuating an injection valve in a motor vehicle.

The layers made of electrode material form the inner electrodes in the finished multi-layered component and can be applied, for example, to the green sheets as a metal paste by means of a screen printing method.

The electrode material may be a Cu alloy, for example copper-palladium (CuPd). Other electrode materials are also possible, for example pure copper.

The piezoelectric green sheets can comprise a material which can be sintered to form lead zirconium titanate (PZT) ceramic.

The first auxiliary material is selected in such a manner that a layer of the first auxiliary material is thinned during the sintering in such a manner that said layer is separated during the firing of the stack, such that delamination of the stack occurs along said layer. Delamination refers to singulation of the stack along the ply which contained the layer of the first auxiliary material.

During the sintering, the first auxiliary material can be thinned by the density of the layer of the first auxiliary material being reduced during the sintering and/or by the porosity of the layer increasing during the sintering. These changes can be triggered by virtue of the fact that material diffuses away from the layer of the first auxiliary material and/or by virtue of the fact that the chemical composition of the first auxiliary material changes.

By way of example, the first auxiliary material can consist of a combination of a first component, a second component and an inert inorganic material. The first component may be a metal which is also a constituent of the electrode material, the metal in the first component being in a bound state, for example oxidized. By way of example, the first component may be CuO.

The second component may be the metal which is also a constituent of the electrode material in pure form. By way of example, the second component may be Cu.

The second component and the inert inorganic material are optional constituents of the first auxiliary material. Accordingly, the proportion of the first component may be up to 100% by weight of the first auxiliary material. It is preferable to select a ratio between the first component and the second component of 50% by weight to 50% by weight.

Alternatively, the first auxiliary material may also comprise an organic paste or a paste containing inorganic material inert to PZT. The first auxiliary material may also consist of a combination of organic and inorganic components. By way of example, the organic paste may comprise $ZrO_2$ and/or $BaTiO_3$ or consist of one of these materials. The inorganic material may be ethyl cellulose.

During the sintering of the stack, the layer of the first auxiliary material is thinned. In this case, for example, a first and a second component of the first auxiliary material can react chemically with one another.

In method step D), according to one embodiment, the first and second component can react to form a third component and/or the first component can decompose into a third and a fourth component and the fourth component can react with the second component to form the first component. By these reactions, the first and the second component of the first auxiliary material can react largely or completely to form the third component after a certain time.

If, for example, the second component is the metal which is also present, for example, as an alloy in the electrode material in pure form, the method has the effect that, through the targeted addition of the first component to the second component in the first auxiliary material, the pure metal in the first auxiliary material is subjected to chemical reactions, whereas the metal in the electrode material is not chemically modified or is chemically modified only to small proportions.

In this case, the first component can likewise contain the metal like the second component and the electrode material, or can contain a metal which differs from the metal of the second component and of the electrode material. If different metals are selected in the first and second component, what can thereby arise are a primary third component, the decomposition product of the first component, and a secondary third component, the reaction product from second component and fourth component.

The decomposition of the first component into the third and fourth component may be, for example, oxygen elimination of a metal oxide. The first component can therefore be a metal oxide, in which the metal is present in a first oxidation stage and which eliminates oxygen, i.e. the fourth component. A metal oxide in which the metal is present in a second oxidation stage can form as the third component owing to the elimination of oxygen. The metal can therefore be oxidized in a targeted manner in the first auxiliary material by the oxygen elimination.

Said reactions, in particular the decomposition of the first component into the third and fourth component, can take place before the maximum sintering temperature is reached. Therefore, the targeted oxidation takes place before the maximum sintering temperature is reached and therefore before the compaction of the component.

The method therefore makes it possible to areally restrict a chemical reaction, for example the oxidation of a metal, in a targeted manner, specifically to the region of the layer which contained the first auxiliary material before the sintering. Therefore, the pure metal in the ply can be completely oxidized, whereas the metal in the electrode material is not attacked or is attacked scarcely.

In conventional methods, in which the oxidation is controlled merely by way of the sintering atmosphere, areally targeted oxidation cannot be achieved, since the oxidation also takes place at the electrode material; this is undesirable since firstly oxidized electrode material can diffuse away and therefore dissolve the electrode layer, and secondly the ply along which the singulation will be effected in step E) cannot be completely degraded.

Furthermore, in method step D), the third component and/or the first component can diffuse toward at least one of the layers containing electrode material.

"Diffuse" is to be understood as meaning that the first and/or third component diffuse to such an extent that they are absorbed by the electrode material or that they diffuse only in the direction of the electrode material and are absorbed by the piezoelectric material through which they diffuse. The second variant takes place, for example, when the first and third component contain no metal which is present in the electrode material.

Once the reactions have been completed, only the third component, which can diffuse, is still present, although it is also possible for residues of the first component to also be present, and these can then likewise diffuse. As a result, the metal oxides which have formed or are already present, in which the metal is present in respectively different oxidation stages, can therefore diffuse toward the electrode material. In this case, the metal diffuses as a cation.

The diffusion can take place once the components have chemically reacted, i.e. when largely only the third component is still present in the ply. The diffusion can also already begin as the aforementioned reactions of the components are still taking place. Furthermore, the diffusion can take place when the maximum sintering temperature has been reached.

A segmentation layer, along which the stack is singulated in step E), can be formed by the diffusion in the region of the layer of the first auxiliary material in the stack. The ply, which contained the auxiliary material before method step D), is therefore degraded, in that the first and second component of the auxiliary material react to form a third component owing to the action of the temperature used for the sintering, and as a result make it possible for the first and/or third component to diffuse in the direction of the electrode layers. A porous layer, which can also be understood to be a segmentation layer, in which the second component has completely reacted and the third component and, if still present, the first component have diffused away, therefore forms in the region of the ply.

According to one embodiment, CuO can be selected as the first component, Cu can be selected as the second component and a Cu alloy can be selected as the electrode material. If the Cu-containing components are selected, the diffusion in method step D) can take place in the form of copper oxides. According to a further embodiment, PdO can be selected as the first component, Cu can be selected as the second component and a Cu alloy can be selected as the electrode material.

Material from the layer of the first auxiliary material can diffuse toward the electrode layers during the sintering. By way of example, CuO or $Cu_2O$ could diffuse through the piezoelectric layer toward the electrode layers. The degree of diffusion is determined here by the difference in Cu concentration between the adjacent layers of electrode material and auxiliary material. The electrode layers can comprise a Cu alloy, the Cu proportion of which is lower than the Cu proportion of the auxiliary material. "In a lower proportion" is to be understood as meaning that the overall concentration of the metal is lower in the electrode material than in the auxiliary material. This difference in concentration has the effect that, during the sintering, diffusion of the metal from the ply to at least one of the layers containing electrode material can take place. This diffusion is effected through the piezoelectric layers adjacent to the ply. By way of example, diffusion of the metal is possible if the metal is present in the vapor phase, as a metal oxide or as pure metal. The mobility of the metal into the piezoelectric layers is given by the difference in concentration as the driving force.

The diffusion behavior can furthermore be improved by virtue of the fact that copper cations, which can arise owing to a chemical reaction between the first and the second component of the first auxiliary material, diffuse more readily than pure copper. After completion of the sintering process, the printed auxiliary material may have been absorbed completely into the inner electrode layers. Accordingly, a segmentation layer remains, running parallel to the inner electrodes in the stack. The porosity of this layer determines the breaking stress of the stack.

Delamination of the stack may now occur during the firing of the stack. During the firing, the stack can firstly be heated rapidly and then cooled rapidly, resulting in a thermal shock during the firing process. This thermal shock may ensure the delamination of the stack.

The firing of the stack can be effected at a temperature which is increased by 10 to 30° C. per minute until a maximum firing temperature is reached. During the firing of the stack, the temperature can be reduced by 10 to 30° C. per minute after the maximum firing temperature has been reached. The reduction of the temperature can be continued until an ambient temperature is reached. The increasing of the temperature can be followed directly by the reducing of the temperature. By setting the temperature ramps to a change in temperature of 10 to 30° C. per minute during heating and cooling, it is possible to achieve the desired temperature shock.

The thermal shock is related directly to the flexural strength of the sintered component. The flexural strength is selected here in such a manner that the method steps which are carried out on the sintered component before the firing can proceed in a stable manner in terms of process technology. These method steps may include thermal processes, such as for example sintering and decarburizing, and other processes, such as for example grinding and metallizing.

The maximum firing temperature can be between 720° C. and 800° C., preferably between 750° C. and 770° C. A maximum firing temperature in this range ensures that delamination occurs along the segmentation layers.

The first auxiliary material can contain at least a first component and a second component, which react chemically with one another in method step D). In this case, the first component may be a metal in bound form and the second component may be a metal in pure form.

The first auxiliary material can furthermore comprise an inert inorganic material. This material can be inert in particular in terms of the sintering process, i.e. it does not change during the sintering. The inert inorganic material can ensure that pores in the layer of the first auxiliary material are kept open during the sintering process. The structure of the inert inorganic material can be compared with that of a stent. The breaking stress of the segmentation layer can be stipulated by the addition of the inert inorganic material and also by the setting of the concentration of this material and the grain size thereof. In particular, after the sintering, merely the inert inorganic material may remain in the layer of the first auxiliary material.

The inert inorganic material may be zirconium(IV) oxide. This is distinguished by a structure with tubular cavities. As described above, these are very similar to the stent and ensure that pores are kept open.

The proportion of the inert inorganic material in the first auxiliary material can be at least 40% by weight. The higher the proportion of the inert inorganic material, the more readily delamination occurs along the respective layer. The inert inorganic material accordingly ensures that the layer is weakened. By way of example, the proportion of the inert inorganic material in the first auxiliary material can be between 40% by weight and 90% by weight, preferably between 50% by weight and 70% by weight. These figures refer to the first auxiliary material in the state in which it is applied to the green sheet, i.e. before the sintering.

In method step C), furthermore at least one ply of a green sheet, which contains the piezoelectric material and to which a layer of a second auxiliary material is applied, can be arranged in the stack, wherein, in method step D), the at least one layer made of the second auxiliary material is thinned, such that a weakening layer is formed in the multi-layered component in the region of the layer made of the second auxiliary material. Delamination along this weakening layer does not occur, however. However, the multi-layered component is mechanically less stable along the weakening layer, such that cracks can arise here with preference during operation of the multi-layered component. In this respect, the cracks can be guided in a controlled manner along the weakening layer. Accordingly, the weakening layer can ensure that uncontrolled tearing of the multi-layered component is avoided or at least reduced.

The first auxiliary material and the second auxiliary material can comprise the same constituents, wherein the proportion of the inert inorganic material is higher in the first auxiliary material than in the second auxiliary material. The two auxiliary materials accordingly differ merely in the proportion of the inert inorganic material in the respective material. In addition, the two auxiliary materials can in particular contain copper oxide as the first component and copper as the second component.

By way of example, the proportion of the inert inorganic material in the second auxiliary material can be between 10% by weight and 35% by weight, preferably between 20% by weight and 30% by weight. These figures refer to the second auxiliary material in the state in which it is applied to the green sheet, i.e. before the sintering.

After method step D) and before the singulation into at least two multi-layered components in method step E), further processing steps can be carried out, in which the multi-layered components are treated in the single-piece stack. These include, for example, the application of an outer electrode, metallization for producing a soldering face, and also the grinding of circumferential edges and end face edges. The grinding can avoid the formation of stress peaks and moreover reduce the manufacturing tolerances.

Since these steps can be carried out on a stack, which is later singulated to form a multiplicity of multi-layered components, jointly for each of these components, the outlay is reduced considerably compared to the treatment of individual components. These advantages are made possible by the use of the layer of the first auxiliary material, along which the stack is singulated during the firing.

Before the singulation into at least two multi-layered components, the edges of the stack can be ground, wherein a force exerted during the grinding is set in such a manner that singulation of the stack does not occur during the grinding.

To this end, a force of 530 to 570 Newtons can be exerted, for example, during the grinding of the circumferential edges. A force of 190 to 230 Newtons can be exerted during the grinding of the end face edges. These figures refer to a stack having a square area with a side length of 6.8 mm and a stack height of 30 mm. If stacks having other geometrical dimensions are used, the force exerted during the grinding should be adapted accordingly.

Hereinbelow, the invention will be described in more detail with reference to figures.

FIG. 1 shows a stack from which a plurality of multi-layered components are produced before the singulation.

FIG. 2 shows multi-layered components which have been produced by singulation of the stack shown in FIG. 1.

FIG. 1 shows a stack 1 from which a plurality of multi-layered components 2 are produced at an early point in time of the production method, in particular before the sintering. FIG. 2 shows the multi-layered components 2 produced from the stack 1.

The stack comprises green sheets 3 containing a piezo-electric material. These green sheets 3 comprise a material which is sintered to form a piezoelectric layer 4. The piezoelectric layer 4 comprises lead zirconium titanate (PZT).

Furthermore, the stack comprises layers of an electrode material 5 which are printed onto green sheets 3. The electrode material 5 is printed on in the form of a metal paste. During the sintering of the stack, the inner electrodes 6a, 6b are formed from the layers of the electrode material 5. The electrode material 5 comprises CuPd. First inner electrodes 6a and second inner electrodes 6b are formed in an alternating manner in the stack. In this case, the first inner electrodes 6a are guided out to a first outer face 7 and are spaced apart from a second outer face 8. The second inner electrodes 6b are guided out to the second outer face 8 and are spaced apart from the first outer face 7.

Furthermore, the stack 1 comprises at least one layer of a first auxiliary material 9 which is applied to a green sheet 3. During the course of the production method, the layer of the first auxiliary material 9 is converted into a segmentation layer, along which two multi-layered components 2 are separated from one another.

The first auxiliary material 9 comprises a first component and a second component. The first component is a metal in a bound state, for example an oxidized metal. The second component is a metal in a pure form. The metal of the first component and the metal of the second component are a metal which is likewise present in the electrode material 5, from which the inner electrodes 6a, 6b are formed.

Furthermore, the first auxiliary material 9 comprises an inert inorganic material. The inert inorganic material is zirconium(IV) oxide. This material is inert to sintering processes.

Moreover, the stack 1 comprises layers of a second auxiliary material 10. The second auxiliary material 10 comprises the same constituents as the first auxiliary material 9, with the proportion of the inert inorganic material being lower in the second auxiliary material 10.

The layer of the second auxiliary material 10 is configured to form a weakening layer 11 in the multi-layered component 2. Cracks can form along the weakening layer 11 upon mechanical loading of the multi-layered component 2 and can be guided along said layer. It is thereby possible to avoid uncontrolled tearing of the multi-layered component 2.

Hereinbelow, firstly the production of the stack 1 shown in FIG. 1 will be described: firstly, green sheets 3 are printed with the electrode material, which later forms the inner electrodes 6a, 6b. Further green sheets 3 are printed with the first auxiliary material 9. Further green sheets 3 are printed with the second auxiliary material 10. Then, the stack 1 is stacked as shown in FIG. 1.

In a next method step, the stack 1 shown in FIG. 1 is sintered. Since a multiplicity of multi-layered components 2 are combined here to form the stack 1, the outlay for this method step is considerably lower compared to sintering of the individual multi-layered components separately from one another.

During the sintering, the layers of the first and of the second auxiliary material 9, 10 are thinned. The layers which comprise the first auxiliary material 9 in this case become segmentation layers, along which the singulation is effected in a later method step. During the sintering, the layers which comprise the second auxiliary material 10 become weakening layers 11, along which a multi-layered component 2 preferably tears during operation.

Then, further method steps are carried out, in which the multi-layered components 2 remain mechanically bound in the stack 1. These include the grinding of the circumferential edges and of the end face edges of the stack 1. The longest edges of the stack 1 are referred to as circumferential edges. These connect the two end faces 12 of the stack 1 to one another. End face edges denote those edges which delimit the end faces 12 of the stack 1.

During the grinding operations, a grinding pressure is set in such a manner that delamination of the stack 1 does not occur.

The application of the outer electrodes 13 by metallization of the first and of the second outer face 7, 8 can also be carried out while the multi-layered components 2 remain bound to form the stack 1. By way of example, the outer electrodes 13 can be applied by a screen printing method or a sputtering method.

Furthermore, a Cu layer, onto which an Ag layer is sputtered, can be applied to one of the outer faces of the stack. This layer sequence makes it possible to solder on contacts in the singulated multi-layered components. This step, too, is carried out while the multi-layered components 2 are mechanically bound in the stack 1. This layer can therefore be produced simultaneously for a multiplicity of multi-layered components 2 in a single process step.

If appropriate, further coating processes can be carried out, for example galvanically, on the stack 1.

Since all of the method steps mentioned here can be carried out on the stack 1 for a multiplicity of multi-layered components 2, it is possible to largely dispense with a complex handling of individual parts in the method.

Then, a firing operation is carried out. During the firing operation, what is termed a thermal shock leads to a singu-lation of the stack 1 along the segmentation layers, on which the first auxiliary material 9 was arranged. To generate the desired thermal shock, during the firing of the stack 1, the stack 1 can be exposed to a temperature which is increased by 10 to 30° C. per minute until a maximum firing temperature is reached and which is then reduced by 10 to 30° C. per minute until an ambient temperature is reached. In this case, the maximum firing temperature can be between 720 and 800° C., preferably between 750 and 770° C.

This procedure leads to a rapid expansion and subsequent re-contraction of the stack 1, giving rise to mechanical stresses which lead to a singulation along the segmentation layer. Singulation does not occur along the weakening layers 11, which are formed at the locations of the second auxiliary material 10, since the layers of the second auxiliary material 10 comprise the inorganic inert material in a smaller pro-portion than the first auxiliary material 9.

FIG. 2 shows a plurality of multi-layered components 2 after the singulation along the segmentation layers.

It should be noted that FIG. 1 and FIG. 2 do not provide illustrations which are true to scale. Thus, for example, the layers of the first and of the second auxiliary material 9, 10 have a height which lies in the same order of magnitude as the height of the printed-on electrode material 5 which is sintered to form the inner electrodes 6a, 6b. By contrast, in FIGS. 1 and 2, the layers of the first and second auxiliary material 9, 10 are shown in significantly thicker form for better illustration.

The invention claimed is:

1. A method for producing piezoelectric multi-layered components, comprising the following steps:
   A. applying an electrode material to green sheets containing a piezoelectric material,
   B. applying a layer of a first auxiliary material to at least one green sheet containing the piezoelectric material,
   C. forming a stack, in which the green sheets, to which electrode material is applied, are arranged one on top of another, wherein at least one ply of the green sheet, to which the layer of the first auxiliary material is applied, is arranged in the stack,
   D. sintering the stack, wherein the layer of the first auxiliary material is thinned, and
   E. firing the stack, wherein the stack is singulated along the at least one ply during the firing into at least two multi-layered components.

2. The method according to claim 1, wherein the firing of the stack is effected at a temperature which is increased by 10 to 30° C. per minute until a maximum firing temperature is reached.

3. The method according to claim 2, wherein, during the firing of the stack, the temperature is reduced by 10 to 30° C. per minute after the maximum firing temperature has been reached.

4. The method according to claim 2, wherein the maximum firing temperature is between 720° C. and 800° C., preferably between 750° C. and 770° C.

5. The method according to claim 1,
   wherein the first auxiliary material contains at least a first component and a second component, which react chemically with one another in method step D).

6. The method according to claim 5, wherein CuO is selected as the first component and Cu is selected as the second component.

7. The method according to claim 1, wherein the first auxiliary material comprises an inert inorganic material.

8. The method according to claim 7, wherein the inert inorganic material is zirconium(IV) oxide.

9. The method according to claim 7, wherein the proportion of the inert inorganic material in the first auxiliary material is at least 40% by weight.

10. The method according to claim 1,
    wherein, in method step C), furthermore at least one ply of a green sheet, which contains the piezoelectric material and to which a layer of a second auxiliary material is applied, is arranged in the stack,
    wherein, in method step D), the at least one layer made of the second auxiliary material is thinned, such that a weakening layer is formed in the multi-layered component in the region of the layer made of the second auxiliary material.

11. The method according to claim 10,
    wherein the first auxiliary material comprises an inert inorganic material,
    wherein the first auxiliary material and the second auxiliary material comprise the same constituents, and
    wherein the proportion of the inert inorganic material is higher in the first auxiliary material than in the second auxiliary material.

12. The method according to claim 1, wherein, after method step D) and before the singulation into at least two multi-layered components in method step E), further processing steps are carried out, in which the multi-layered components are treated in the single-piece stack.

13. The method according to claim 1, wherein, before the singulation into at least two multi-layered components, edges of the stack are ground, wherein a grinding pressure is set in such a manner that singulation does not occur during the grinding.

14. The method according to claim 1, wherein the singulation during the firing is initiated by the previous weakening of the layer of the first auxiliary material during the sintering and by a temperature shock which is generated during the firing by rapid changes in temperature.

15. A method for producing piezoelectric multi-layered components, comprising the following steps:
    A. applying an electrode material to green sheets containing a piezoelectric material,
    B. applying a layer of a first auxiliary material to at least one green sheet containing the piezoelectric material,
    C. forming a stack, in which the green sheets, to which electrode material is applied, are arranged one on top of another, wherein at least one ply of the green sheet, to which the layer of the first auxiliary material is applied, is arranged in the stack,
    D. sintering the stack, wherein the layer of the first auxiliary material is thinned, and
    E. firing the stack, wherein the stack is singulated along the at least one ply into at least two multi-layered components, wherein the singulation during the firing is initiated by the previous weakening of the layer of the first auxiliary material during the sintering and by a temperature shock which is generated during the firing by rapid changes in temperature.

16. A method for producing piezoelectric multi-layered components, comprising the following steps:
    A. applying an electrode material to green sheets containing a piezoelectric material,
    B. applying a layer of a first auxiliary material to at least one green sheet containing the piezoelectric material, wherein the first auxiliary material comprises an inert inorganic material and the proportion of the inert inorganic material in the first auxiliary material is at least 40% by weight,
    C. forming a stack, in which the green sheets, to which electrode material is applied, are arranged one on top of another, wherein at least one ply of the green sheet, to which the layer of the first auxiliary material is applied, is arranged in the stack,
    D. sintering the stack, wherein the layer of the first auxiliary material is thinned, and
    E. firing the stack, wherein the stack is singulated along the at least one ply into at least two multi-layered components.

* * * * *